United States Patent
Arya et al.

(12)

(10) Patent No.: US 9,208,529 B2
(45) Date of Patent: Dec. 8, 2015

(54) SMOOTHING POWER OUTPUT FROM A WIND FARM

(75) Inventors: Vijay Arya, Bangalore (IN); Partha Dutta, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 274 days.

(21) Appl. No.: 13/441,235

(22) Filed: Apr. 6, 2012

(65) Prior Publication Data

US 2013/0268463 A1 Oct. 10, 2013

(51) Int. Cl.
| | |
|---|---|
| G06F 19/00 | (2011.01) |
| G06Q 40/00 | (2012.01) |
| G06Q 50/06 | (2012.01) |
| G06Q 10/04 | (2012.01) |
| G06Q 10/06 | (2012.01) |
| G01R 22/00 | (2006.01) |

(52) U.S. Cl.
CPC .............. *G06Q 50/06* (2013.01); *G01R 22/00* (2013.01); *G06Q 10/04* (2013.01); *G06Q 10/06* (2013.01); *Y04S 10/54* (2013.01); *Y04S 10/58* (2013.01); *Y04S 50/10* (2013.01)

(58) Field of Classification Search
CPC ............. G06Q 50/06; G06Q 30/0202; G06Q 10/06315; G06Q 30/0206; G06Q 10/04; G06Q 10/06; Y04S 10/58; Y04S 10/54; Y04S 50/10; G01R 22/00
USPC ............................................ 702/61; 705/7.35
See application file for complete search history.

(56) References Cited

U.S. PATENT DOCUMENTS

| | | | |
|---|---|---|---|
| 6,946,751 B2 | 9/2005 | Yoshida et al. | |
| 7,432,611 B2 | 10/2008 | Stahlkopf | |
| 2003/0074245 A1 | 4/2003 | Salle | |
| 2007/0001461 A1 | 1/2007 | Hopewell | |
| 2008/0228553 A1* | 9/2008 | Bryson et al. | 705/10 |
| 2010/0164473 A1 | 7/2010 | Caird | |

(Continued)

FOREIGN PATENT DOCUMENTS

| | | |
|---|---|---|
| CN | 102082433 A | 6/2011 |
| CN | 102368617 A | 7/2012 |

(Continued)

OTHER PUBLICATIONS

Khalid et al., A Model Predictive Control Approach to the Problem of Wind Power Smoothing with Controlled Battery Storage, IEEE Dec. 2009.

(Continued)

*Primary Examiner* — Andrew Schechter
*Assistant Examiner* — John Kuan
(74) *Attorney, Agent, or Firm* — Ryan, Mason & Lewis, LLP (57) ABSTRACT

An apparatus and an article of manufacture for determining consistent wind power output include obtaining forecasted wind power production, actual wind power production from a wind power producer, a variable price of power measurement, a power storage battery state and capacity measurement, and a penalty measurement for wind power change of rate, and analyzing the forecasted wind power production, the variable price of power measurement, the power storage battery state and capacity measurement, and the penalty measurement for wind power change of rate to determine a consistent rate at which wind power is to be exported from the wind power producer to a grid.

13 Claims, 8 Drawing Sheets

(56) References Cited

U.S. PATENT DOCUMENTS

| | | | |
|---|---|---|---|
| 2011/0022434 A1* | 1/2011 | Sun et al. ........................ | 705/7 |
| 2011/0288691 A1 | 11/2011 | Abe et al. | |
| 2012/0053750 A1* | 3/2012 | Viassolo et al. ............. | 700/297 |
| 2012/0191262 A1* | 7/2012 | Marcus ........................ | 700/286 |
| 2013/0113212 A1* | 5/2013 | Sakamoto et al. ............. | 290/44 |
| 2014/0039710 A1* | 2/2014 | Carter et al. ................. | 700/291 |

FOREIGN PATENT DOCUMENTS

| | | |
|---|---|---|
| EP | 1460266 A2 | 9/2004 |
| JP | 2008054385 A | 3/2008 |
| JP | 2010071159 A | 4/2010 |

OTHER PUBLICATIONS

Tsinis, The Role of Energy Storage in Helping Global Energy Problems, Apr. 13, 2009.

Chandy et al., A Simple Optimal Power Flow Model with Energy Storage, Dec. 2010.

Pinson et al., From Probabilistic Forecasts to Statistical Scenarios of Short-Term Wind Power Production, Wind Energy (2008).

Teleke et al., Rule-Based Control of Battery Energy Storage for Dispatching Intermittent Renewable Sources. IEEE, Oct. 2010.

Kraemer, How Denmark will Integrate 50% Wind Power by 2025, Mar. 5, 2011, http://cleantechnica.com/2011/03/05/how-denmark-will-integrate-50-wind-power-by-2025/.

Xcel Energy Selects GridPoint Software Platform for Wind-to-Battery Project, http://www.gridpoint.com/news/downloaded May 1, 2012.

Teleke et al., Control Strategies for Battery Energy Storage for Wind Farm Dispatching, IEEE Transactions on Energy Conversion, vol. 24, No. 3, 2009.

Prediktor, http://www.prediktor.dk/ downloaded May 1, 2012.

Previento, http://energymeteo.de downloaded May 1, 2012.

GH Forecaster, http://www.gl-garradhassan.com downloaded May 1, 2012.

Weprog, http://www.weprog.com downloaded May 1, 2012.

Aeolis, http://www.windknowhow.com downloaded May 1, 2012.

Awst, http://www.awstruepower.com/solutions/wind/forecasting-grid-integration/ downloaded May 1, 2012.

Visionpoint, http://www.windlogics.com/operate-windenergyforecasting.html downloaded May 1, 2012.

PowerSight, http://www.3tier.com downloaded May 1, 2012.

Precise Stream, http://www.precisionwind.com/forecasting/tools.html downloaded Aug. 2, 2012.

WindCast, http://www.wsi.com/products-energy-trading-windcast.htm downloaded Aug. 2, 2012.

Wind Power Forecast state-of-the-art-2009, Argonne National Lab Report for Dept of Energy, US, http://www.dis.anl.gov downloaded May 1, 2012.

Wind Power Forecasting, Wikipedia, http://en.wikipedia.org/wiki/Wind_power_forecasting downloaded May 1, 2012.

Paatero et al., Effect of Energy Storage on Variations in Wind Power, Wind Energy, vol. 8, No. 4, pp. 421-441, Mar. 7, 2005.

* cited by examiner

SMOOTHING POWER OUTPUT FROM A WIND FARM

FIELD OF THE INVENTION

Embodiments of the invention generally relate to information technology, and, more particularly, to power optimization.

BACKGROUND

Wind power is a prominent form of renewable energy being used all over the world today. However, wind power can be intermittent and highly variable. Wind speeds and the resulting power vary over different time scales and depend on various factors such as weather, temperature, height of the mill, size of turbine blades, etc.

Merchant producers and consumers interact using wholesale electricity markets such as day-ahead and real-time (RT) markets, intraday markets, and hour-ahead markets. In day-ahead markets, producers and consumers submit bids and requirements to an independent system operator (ISO) that solves security constrained unit commitment (SCUC) and security constrained economic dispatch (SCED) problems to determine the amount of electricity bought from each producer and the marginal prices of electricity at each location for the next day. In RT markets, based on actual consumption and production, market participants may bid their remaining resources, and an ISO solves a SCED problem periodically (for example, every five minutes).

Conventional power generation sources are penalized if they deviate from their commitments. Due to variability and limited predictability of renewable resources, existing wind power optimization approaches lack a proper mechanism for wind power producers to participate in day-ahead markets. Currently, wind power is settled at the RT price or sold on long-term power purchase agreements.

Additionally, in general, if a grid load is low and generation is high (for example, at night, when wind speeds are higher), wind plant operators cannot sell the power to the grid and resources are wasted. Accordingly, existing approaches are not optimal for wind farm operators as the operators are unable to get the maximum economic gain for the power they generate.

Additionally, existing grid storage approaches include the use of batteries. However, such approaches include battery costs that are significant and such approaches also face sustainability challenges.

Accordingly, there is a need for variability to be reduced for integration into grid and electricity markets at a constant rate.

SUMMARY

In one aspect of the present invention, techniques for smoothing power output from a wind farm are provided. An exemplary computer-implemented method for determining consistent wind power output can include steps of obtaining forecasted wind power production, actual wind power production from a wind power producer, a variable price of power measurement, a power storage battery state and capacity measurement, and a penalty measurement for wind power change of rate, and analyzing the forecasted wind power production, the variable price of power measurement, the power storage battery state and capacity measurement, and the penalty measurement for wind power change of rate to determine a consistent rate at which wind power is to be exported from the wind power producer to a grid.

Another aspect of the invention or elements thereof can be implemented in the form of an article of manufacture tangibly embodying computer readable instructions which, when implemented, cause a computer to carry out a plurality of method steps, as described herein. Furthermore, another aspect of the invention or elements thereof can be implemented in the form of an apparatus including a memory and at least one processor that is coupled to the memory and operative to perform noted method steps.

Yet further, another aspect of the invention or elements thereof can be implemented in the form of means for carrying out the method steps described herein, or elements thereof; the means can include (i) hardware module(s), (ii) software module(s), or (iii) a combination of hardware and software modules; any of (i)-(iii) implement the specific techniques set forth herein, and the software modules are stored in a tangible computer-readable storage medium (or multiple such media).

Additionally, another aspect of the invention or elements thereof can be implemented in the form of a system for determining consistent wind power output, the system including an interface for interfacing with a monitoring device at a wind power producer to measure actual power generated by the producer, an interface for interfacing with an energy storage management system to collect battery data, an interface for interfacing with a wind forecast system to collect a wind power forecast for the wind power producer, an interface for interfacing with one or more entities to collect energy prices and variation penalty information, a server to analyze the collected forecasted wind power production, the measured actual wind power production from the wind power producer, the collected energy prices, power storage battery state and capacity measurement from the collected battery data, and the collected penalty information for wind power change of rate to determine a consistent rate at which wind power is to be exported from the wind power producer to a grid and produce instructions for the exporting, and an output limiter to process the instructions on the consistent rate at which wind power is to be exported from the wind power producer to a grid These and other objects, features and advantages of the present invention will become apparent from the following detailed description of illustrative embodiments thereof, which is to be read in connection with the accompanying drawings.

DETAILED DESCRIPTION

As described herein, an aspect of the present invention includes smoothing power output from wind farms. At least one embodiment of the invention includes considering a forecasted wind power production curve, the variable price of power, measurement of battery state and capacity, and a penalty of rate change, and outputting a piece-wise linear consumption or export curve that results in increased or maximized profit to a wind farm operator.

At least one embodiment of the invention can also include a system between a wind farm and a power grid that takes, as input, a forecasted power production curve, variable price of power, battery state and capacity, and penalty for change of rate, and outputs a series of (rate, duration) pairs at which power is to be exported into the grid. An aspect of the invention further includes an optimization method that computes an optimally smooth consumption curve c(t) that maximizes total profit. Example embodiments of the invention can be used to integrate wind power into a grid as well as electricity markets.

Figure 1:
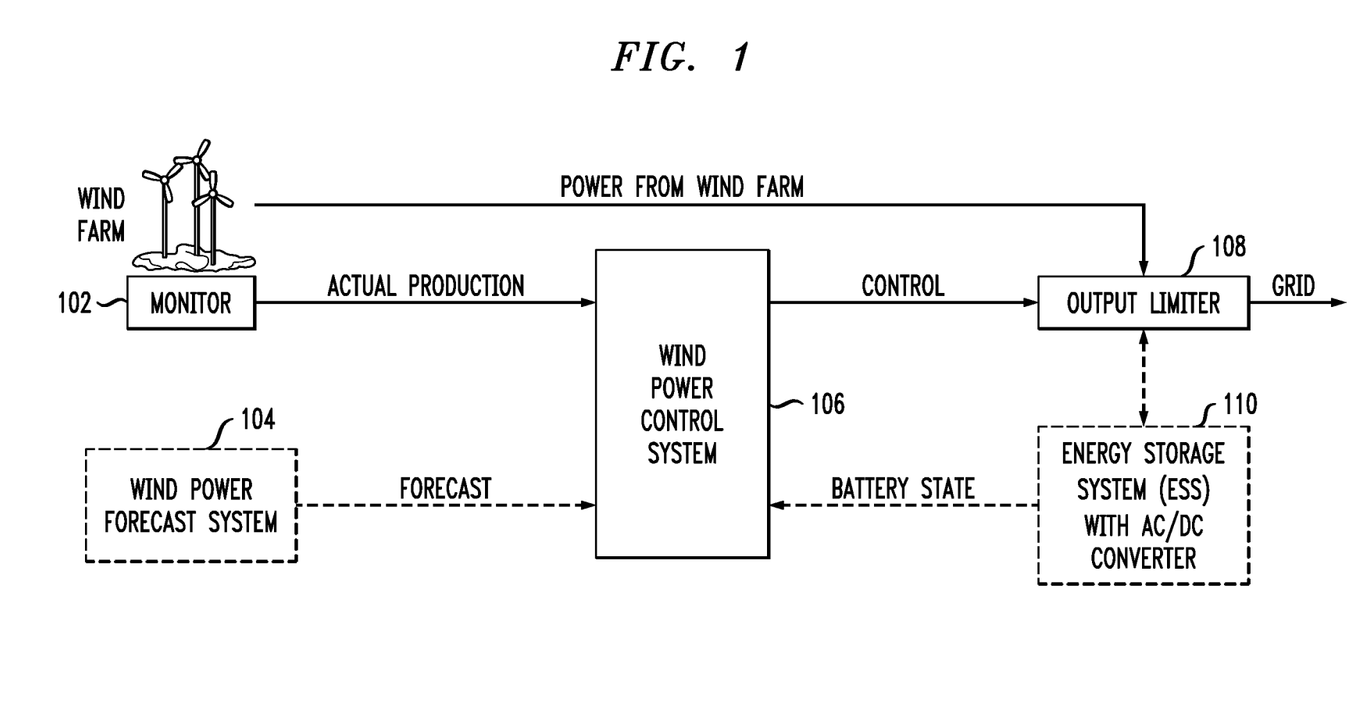
FIG. 1 is a diagram illustrating an example existing wind power integration system.

FIG. 1 is a diagram illustrating an example existing wind power integration system. By way of illustration, FIG. 1 depicts a wind farm with a monitor component 102, which sends actual production to a wind power control system 106 as well as power to an output limiter component 108. Also, a wind power forecast system 104 can send a forecast to the wind power control system. The wind power control system provides control to the output limiter 108, which provides input to the grid and also interacts with an energy storage system (ESS) 110 with an alternating current/direct current (AC/DC) converter. Additionally, the ESS 110 provides battery state information to the control system 106.

As detailed herein, existing systems (such as depicted in FIG. 1) do not dispatch a smooth power output that maximizes revenue based on energy prices, penalty, battery state, and wind power forecast. Existing systems output wind power to the grid with some control over output voltage. However, as noted herein, existing approaches disadvantageously cannot produce a constant rate output. Additionally, existing systems use limited or no storage, and wind power is generally wasted at times when generation is high and load is low.

Figure 2:
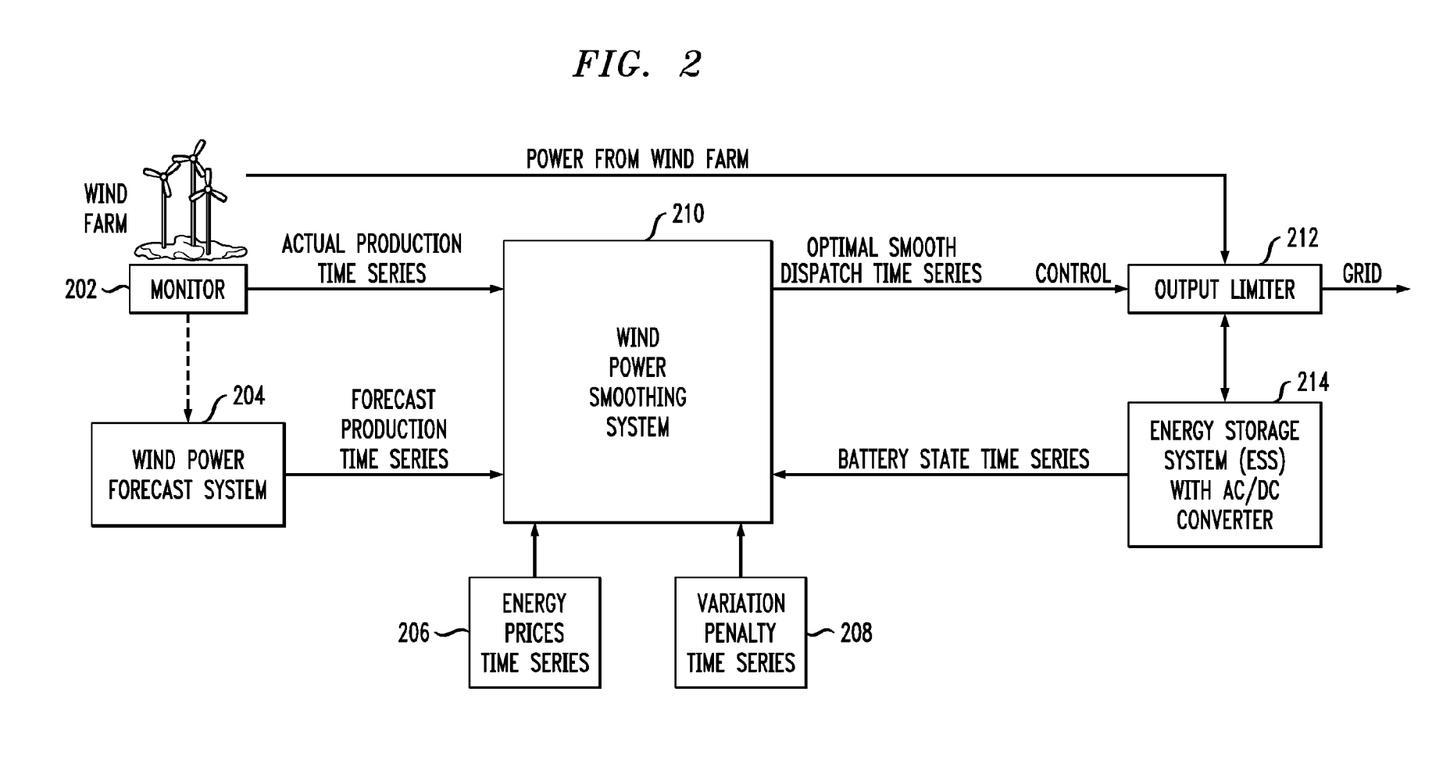
FIG. 2 is a diagram illustrating a wind power integration system, according to an embodiment of the present invention.

FIG. 2 is a diagram illustrating a wind power integration system, according to an embodiment of the present invention. By way of illustration, FIG. 2 depicts a wind farm with a monitoring component 202, which provides power to an output limiter component 212 as well as an actual production time series to a wind power smoothing system 210. The monitoring component 202 also provides input to a wind power forecast system 204, which provides a forecast production time series to the wind power smoothing system 210.

Additionally, FIG. 2 depicts an energy prices time series component 206 and a variation penalty time series component 208, which provide input to the wind power smoothing system 210. Further, the wind power smoothing system 210 provides an optimal smooth dispatch time series (with control) to the output limiter component 212, which sends input to the grid and also interacts with an ESS 214 with an AC/DC converter. The ESS 214 also provides a battery state time series to the wind power smoothing system 210.

As depicted in FIG. 2, at least one embodiment of the invention can be implemented in discrete time steps to output the optimal smooth rate at which the power is to be exported to the grid. In such an embodiment, the system takes into account the predicted and actual wind power, energy prices, battery state and characteristics, and the penalty for variation to determine a smooth rate that maximizes profit. Additionally, in at least one embodiment of the invention, the system works in an online manner and, at each time step, solves a mathematical program (as described herein) to determine the rate at which power is be exported during the next time step. The techniques and system can be used, for example, by a wind farm operator to export power to the grid to maximize revenue.

Figure 3:
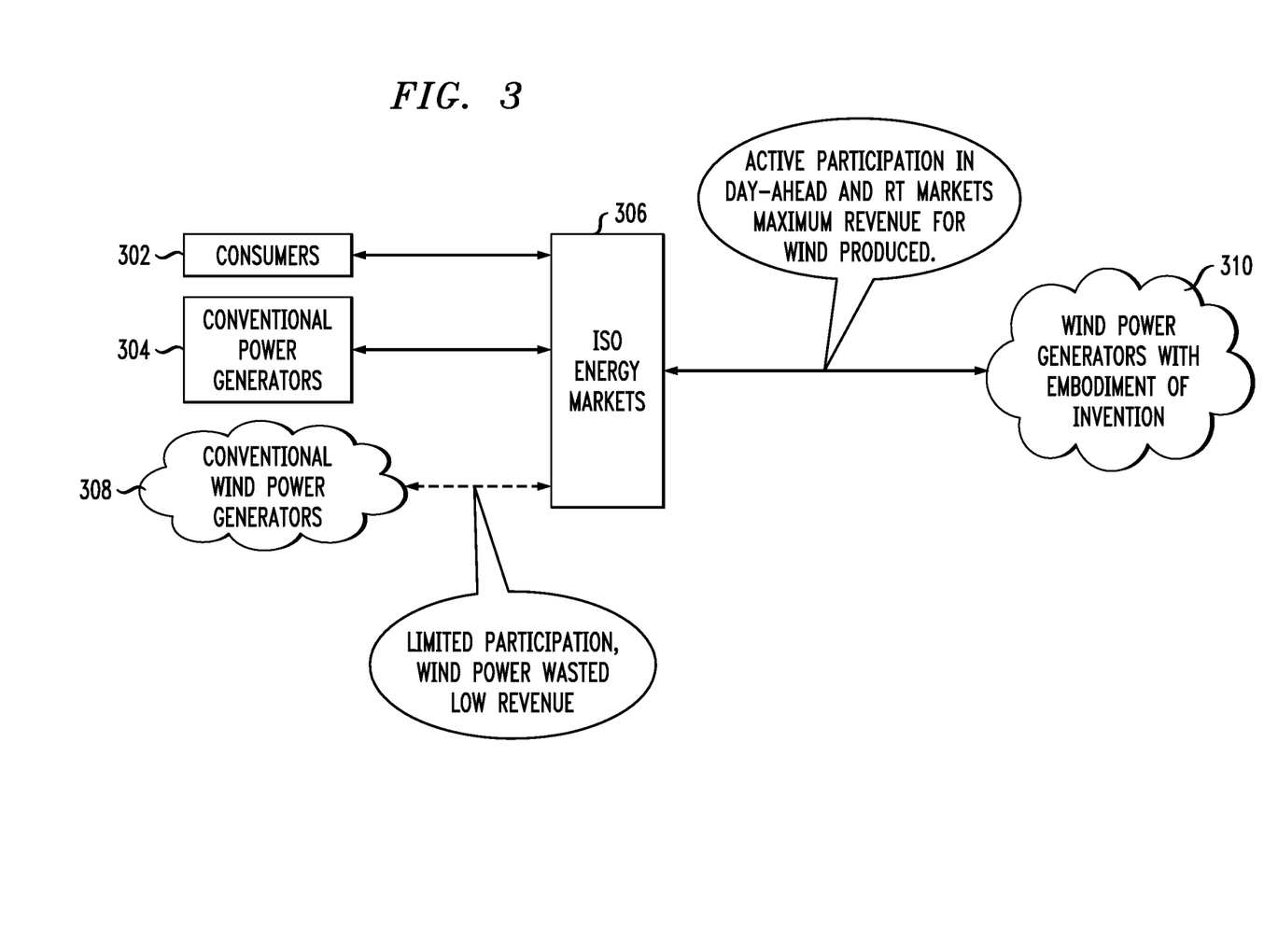
FIG. 3 is a diagram illustrating example implementation of an embodiment of the present invention.

FIG. 3 is a diagram illustrating example implementation of an embodiment of the present invention. By way of illustration, FIG. 3 depicts consumers 302 and conventional power generators 304, which interact with International Organization for Standardization (ISO) energy markets 306. Additionally, FIG. 3 depicts normal (or conventional) wind power generators 308, which have limited participation with the energy markets 306, resulting in wasted wind power and lower revenue for producers.

FIG. 3 also depicts wind generators implementing an embodiment of the invention 310, which can have active participation in day-ahead markets by facilitating quoting of an accurate amount of power and price based on the wind power curve output by the system (as detailed herein), as well as real-time (RT) markets by outputting power at a piece-wise constant rate that maximizes revenue, to provide increased or maximized revenue for wind produced.

As a result, ISOs can use procedures such as those used with conventional energy sources for wind power. Additionally, wind farm operators can obtain increased or maximized economic benefit for the power they generate. Such a smooth curve output can also enable ISOs to utilize more green power and reduce dependence on non-renewable sources of power.

Figure 4:
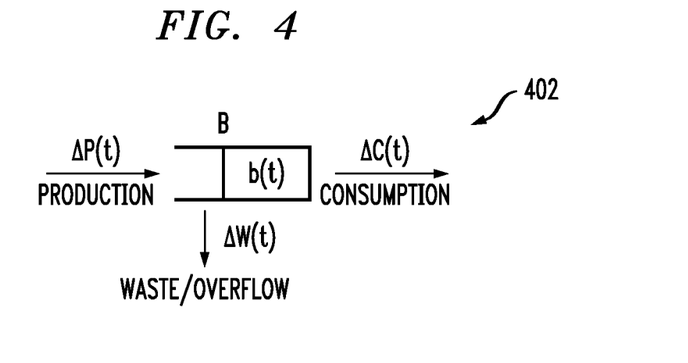
FIG. 4 is a diagram illustrating a model and notation, according to an embodiment of the present invention.

FIG. 4 is a diagram illustrating a model 402 and notation, according to an embodiment of the present invention. Additionally, for example, consider the following:

$$b(t)=\min\{[b(t-1)+\Delta P(t)-\Delta C(t)]^+, B\}.$$

At least one embodiment of the invention includes modeling using cumulative quantities. As used herein, P(t) represents (forecast) cumulative power produced by time step t. Additionally, A(t) represents actual cumulative power produced by time step t. C(t) represents cumulative power exported to grid by time step t. W(t) represents cumulative power wasted by time step t. Further, b(t) represents battery state, that is, the amount of power available in the battery at the end of time step t. B represents battery capacity. Price(t) represents the price of unit power. Also, penalty(t) represents the price per unit change.

Figure 5:
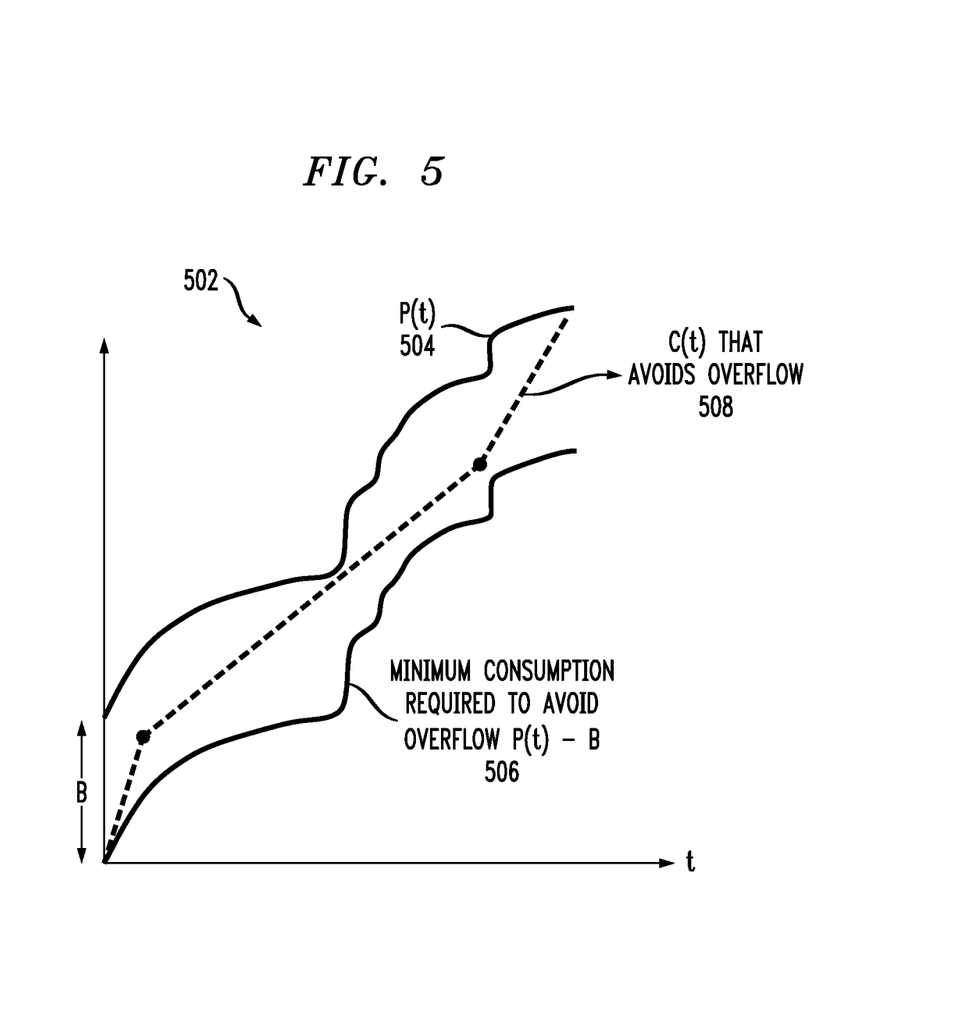
FIG. 5 is a graph illustrating an example measure of cumulative power exported to grid that avoids overflow, according to an embodiment of the present invention.

FIG. 5 is a graph 502 illustrating an example measure of cumulative power exported to grid that avoids overflow, according to an embodiment of the present invention. By way of illustration, FIG. 5 depicts a production curve P(t) curve 504, a curve 506 representing the minimum consumption required to avoid overflow (P(t)-B), and an export curve C(t) curve 508 that avoids overflow. P(t) is the power produced by the wind farm until time step t. As detailed herein, an aspect of the invention includes computing a feasible C(t) that is optimal and smooth.

Figure 6:
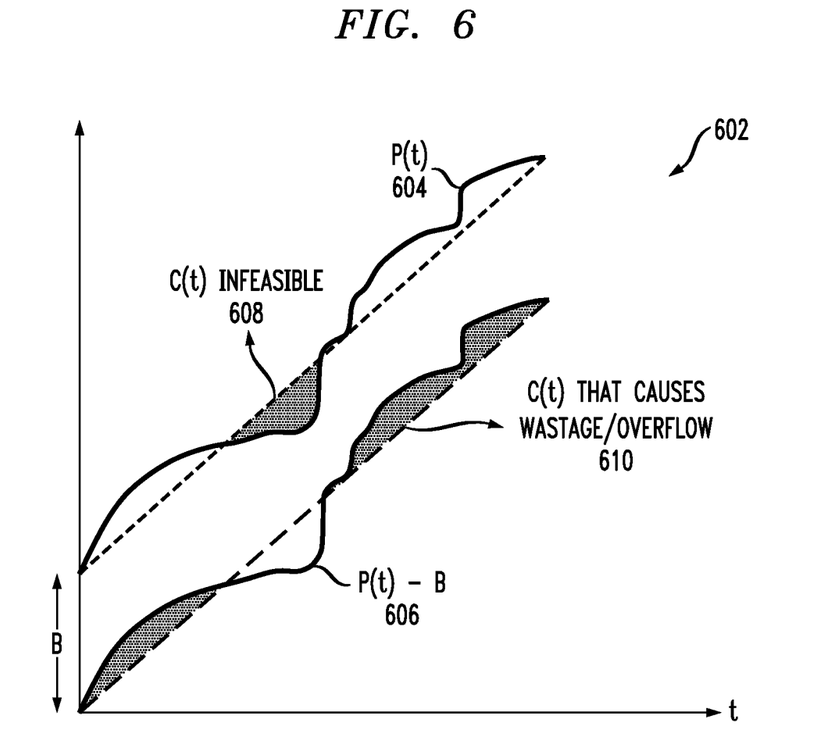
FIG. 6 is a graph illustrating example measures of cumulative power exported to grid, according to an embodiment of the present invention.

FIG. 6 is a graph 602 illustrating example measures of cumulative power exported to grid, according to an embodiment of the present invention. By way of illustration, FIG. 6 depicts a P(t) curve 604, a curve 606 representing the minimum consumption required to avoid overflow (P(t)-B), a C(t) infeasible curve 608, and a C(t) curve 610 that causes wastage/overflow.

Figure 7:
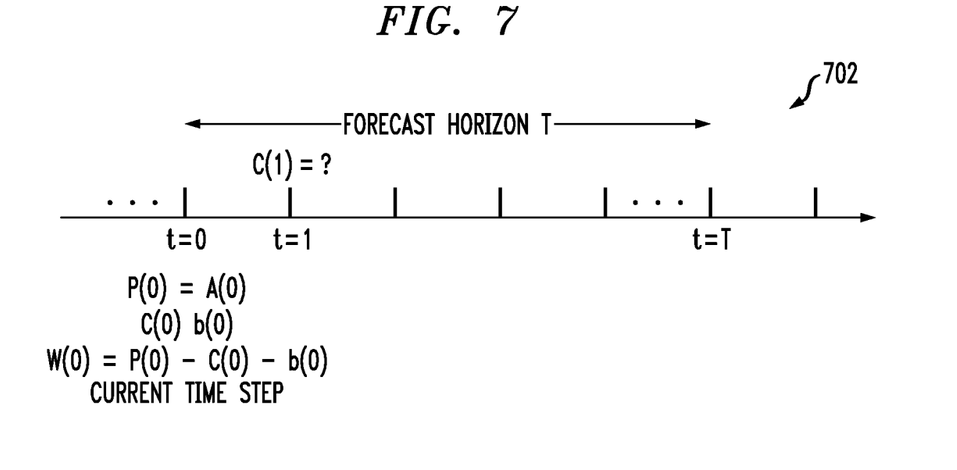
FIG. 7 is a diagram illustrating the quantities known and calculated at each time step in an online manner, according to an example embodiment of the present invention.

FIG. 7 is a diagram 702 illustrating the quantities known and calculated at each time step according to an example embodiment of the present invention. Given the quantities corresponding to the current time step 0 and the quantities corresponding to the forecast horizon of duration T, the objective, as described herein, is to compute the amount of power C(1) that is to be exported at the next time step 1.

Figure 8:
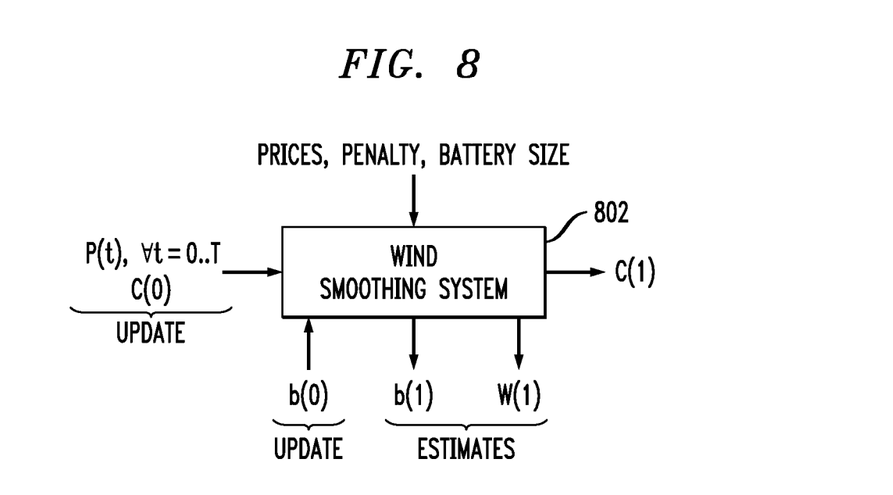
FIG. 8 is a diagram illustrating a wind smoothing system component, according to an embodiment of the present invention.

FIG. 8 is a diagram illustrating a wind smoothing system component 802, according to an embodiment of the present invention. As described herein, at least one embodiment of the invention works in an online manner. Given the wind power forecast for the next T time steps and the current state of the battery, the system outputs the amount of power that is to be exported into the grid in the next time step. Accordingly, a mathematical program is solved to determine C(t), b(t), W(t)∀t=1 . . . T.

In an example embodiment of the invention, it is assumed that in the next time step, if ΔA(1)>ΔC(1), the balance is buffered, and if ΔA(1)<ΔC(1), the balance is drawn from the battery to serve C(1). Additionally, the process can be repeated at each time step; that is, for every time interval, an optimization problem is solved, such as detailed, for example, below.

Inputs: ∀t:

P(t) represents cumulative power production. B represents battery capacity. Price(t) represents the price of unit power. Additionally, penalty(t) represents the price per unit change.

$$\left.\begin{array}{cc} C(0) & P(0) \\ b(0) & W(0) \end{array}\right] \text{-- initial states.}$$

Constraints: ∀t:

P(t)=C(t)+b(t)+W(t)—conservation b(t)≤B—battery capacity constraint $$\left.\begin{array}{c} C(t) \geq C(t-1) \\ W(t) \geq W(t-1) \end{array}\right] \text{-- cumulative}$$

$$\left.\begin{array}{c} \Delta C(t) = C(t) - C(t-1) \\ -A(t) \leq \Delta C(t) - \\ \Delta C(t-1) \leq A(t) \end{array}\right] \text{-- linearize absolute constraint}$$

$$\left.\begin{array}{cc} C(t) \geq 0 & W(t) \geq 0 \\ b(t) \geq 0 & A(t) \geq 0 \end{array}\right] \text{-- positive values,}$$

wherein V(t) represents a maximum of the change in the amount of power exported to the grid at time step t.

To determine: ∀t:

C(t) represents cumulative consumption (piece-wise linear). W(t) represents cumulative wastage. Also, b(t) represents battery state at end of time step t.

Objective: Maximize $ gain.

$$\max_{C(t),b(t),W(t) \forall t} \sum_t \Delta C(t) \text{Price}(t) - \sum_t A(t) \text{Penalty}(t)$$

Integer constraints: waste power only if battery is full.

$$\left.\begin{array}{l} \Delta W(t) \leq My(t) \\ b(t) \geq By(t) \\ M = \max_t \Delta P(t) \\ y(t) \in \{0, 1\} \end{array}\right] \text{ If } \Delta W(t) > 0 \text{ then } b(t) = B$$

The above formulation of optimization is an integer linear program due to the integer constraints above, which ensure that there is wastage of power only when the battery is full. Also, in at least one embodiment of the invention, the integer constraints above can be replaced by the following linear post-processing step.

Linear post-processing alternative to integer constraints:
for t=T . . . 1 b(t)←min{b(t)+ΔW(t),B}

W(t)←W(t)−b(t).

By ignoring the integer constraints above, the optimization formulation becomes a LP (Linear Program) that can be solved in polynomial time. Due to the cumulative constraints on W(t), the LP optimization wastes power instead of buffering only when the balance between C(t) and P(t) cannot be utilized and it does not matter whether this balance is put in W(t) or b(t). Additionally, there is no change in the objective and no constraints violated. Further, as noted, this optimization is accomplished in polynomial time.

Figure 9:
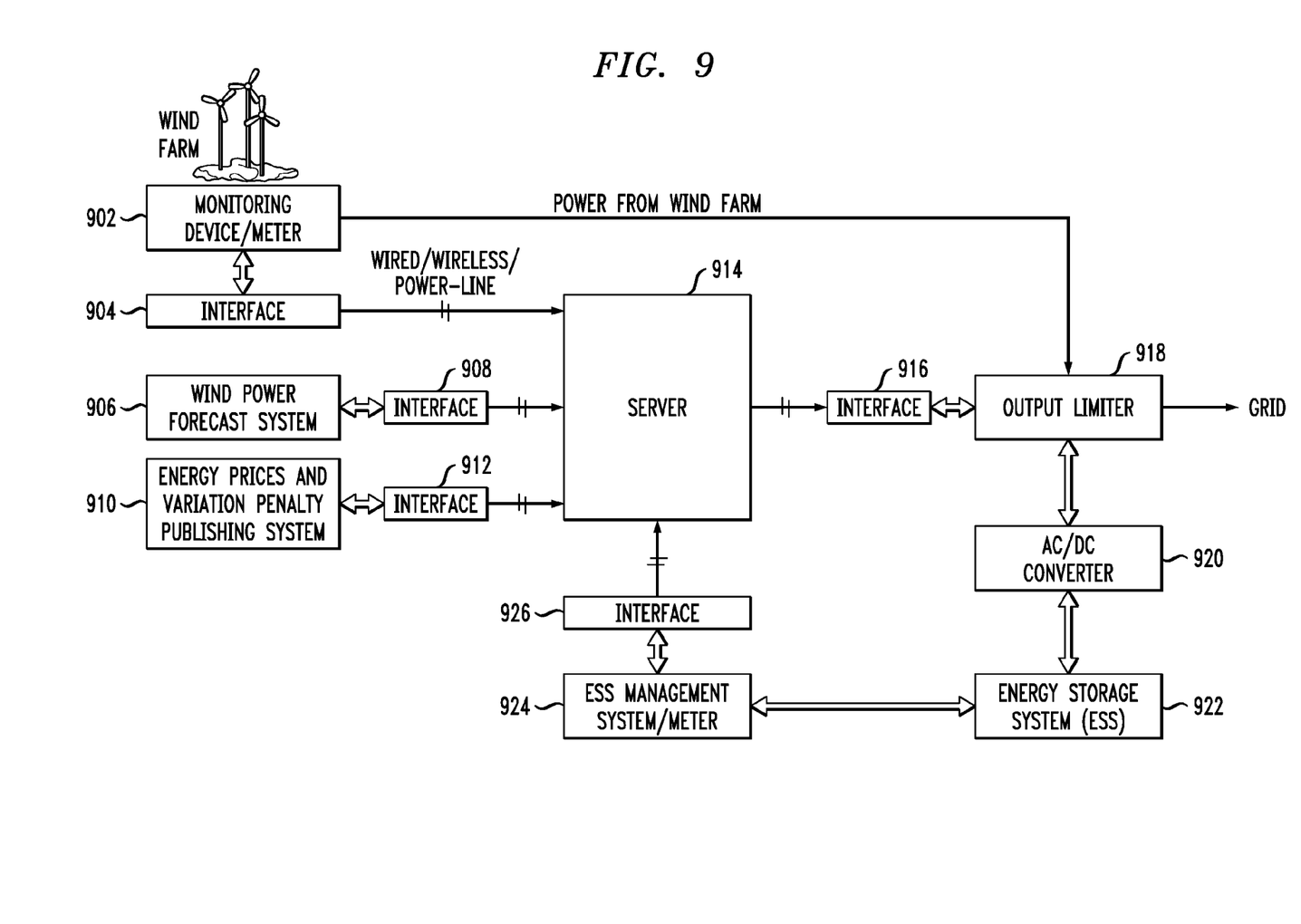
FIG. 9 is a diagram illustrating example components, according to an embodiment of the present invention.

FIG. 9 is a diagram illustrating example components, according to an embodiment of the present invention. By way of illustration, FIG. 9 depicts a wind farm with a monitoring device/meter 902 with a corresponding interface component 904. The monitoring device 902 provides power from the wind farm to an output limiter component 918, and the interface component 904 interacts (via a connection such as wired, wireless, power-line, etc.) with a server 914. FIG. 9 also depicts a wind power forecast system component 906 with a corresponding interface component 908, which interacts with the server 914. Additionally, FIG. 9 depicts an energy prices and variation penalty publishing system component 910 with a corresponding interface component 912, which also interacts with the server 914.

The server also interacts with the interface component 916 corresponding to the output limiter component 918, which outputs information to the grid. The output limiter 918 also interacts with an AC/DC converter 920, which further interacts with an ESS 922. The ESS 922 interacts with an ESS management system/meter 924, which has a corresponding interface 926 that interacts with the server 914.

In at least one embodiment of the invention, the server 914 houses a wind power smoothing system (such as depicted in FIG. 2 and/or FIG. 8), which carries out equations and algorithms such as described herein. Further, the output limiter and the interfaces can be modified according to different embodiments of the invention, and as would be appreciated by one skilled in the art.

Figure 10:
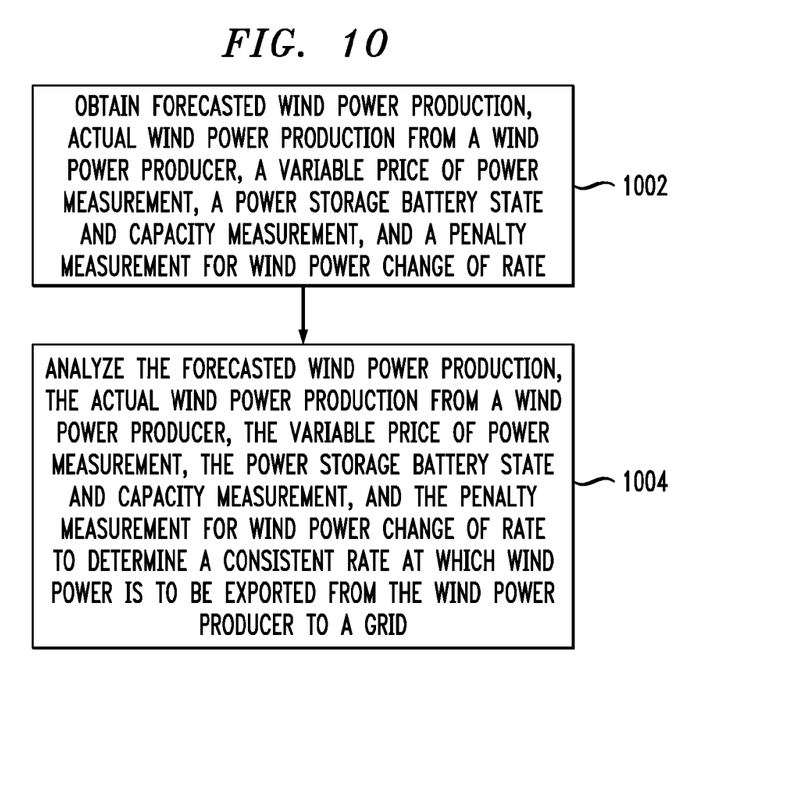
FIG. 10 is a flow diagram illustrating techniques for determining consistent wind power output, according to an embodiment of the invention.

FIG. 10 is a flow diagram illustrating techniques for determining consistent wind power output, according to an embodiment of the present invention. Step 1002 includes obtaining forecasted wind power production, actual wind power production from a wind power producer, a variable price of power measurement, a power storage battery state and capacity measurement, and a penalty measurement for wind power change of rate. Obtaining actual wind power production from a wind power producer can include interfacing with a monitoring device at the wind power producer to measure actual power generated by the producer. Obtaining a power storage battery state and capacity measurement can include interfacing with an energy storage management system to collect battery data.

Also, obtaining forecasted wind power production can include interfacing with a wind forecast system to collect a wind power forecast for the wind power producer. Additionally, obtaining a variable price of power measurement and a penalty measurement for wind power change of rate can include interfacing with one or more entities to collect energy prices and variation penalty information (for example, published by a server on the web).

Step 1004 includes analyzing the forecasted wind power production, the actual wind power production from a wind power producer, the variable price of power measurement, the power storage battery state and capacity measurement, and the penalty measurement for wind power change of rate to determine a consistent rate at which wind power is to be exported from the wind power producer to a grid. In at least one embodiment of the invention, the determined rate is the rate which maximizes the producer's revenue. Determining a consistent rate at which wind power is to be exported from the wind power producer can further include managing an energy storage system.

Also, in at least one embodiment of the invention, this step can include analyzing at each of multiple discrete time steps to determine the rate at which power is to be exported from the power producer to the grid during a next discrete time step. Further, analyzing at each of multiple discrete time steps to determine the rate at which power is to be exported from the power producer to the grid during a next discrete time step can include solving an optimization problem once every K time steps using a linear program to determine a consistent output rate for the next time step.

As detailed herein, at least one embodiment of the invention is carried out continuously in an online manner. Also, the techniques depicted in FIG. 10 can include outputting, to an output limiter component, a storage battery state and capacity and a series of rate-duration pairs at which power is to be exported to the grid. Additionally, an aspect of the techniques depicted in FIG. 10 also includes sending the obtained measurements to at least one server for carrying out the analyzing step.

Further, at least one embodiment of the invention can include integrating an energy storage management system to manage an energy storage system (for example, a battery).

As also detailed herein, an aspect of the invention can include a system for providing consistent wind power output. Such a system can include an interface for interfacing with a monitoring device at a wind power producer to measure actual power generated by the producer, an interface for interfacing with an energy storage management system to collect battery data, an interface for interfacing with a wind forecast system to collect a wind power forecast for the wind power producer, and an interface for interfacing with one or more entities to collect energy prices and variation penalty information.

The system can additionally include a server to analyze the collected forecasted wind power production, the measured actual wind power production from the wind power producer, the collected energy prices, power storage battery state and capacity measurement from the collected battery data, and the collected penalty information for wind power change of rate to determine a consistent rate at which wind power is to be exported from the wind power producer to a grid and produce instructions for the exporting, and an output limiter (for example, a power electronics circuit or a processor controlled digital equipment) to process the instructions on the consistent rate at which wind power is to be exported from the wind power producer to a grid. Also, in at least one embodiment of the invention, such a system can include an energy storage management system to manage an energy storage system as detailed herein.

The techniques depicted in FIG. 10 can also, as described herein, include providing a system, wherein the system includes distinct software modules, each of the distinct software modules being embodied on a tangible computer-readable recordable storage medium. All the modules (or any subset thereof) can be on the same medium, or each can be on a different medium, for example. The modules can include any or all of the components shown in the figures. In an aspect of the invention, the modules can run, for example on a hardware processor. The method steps can then be carried out using the distinct software modules of the system, as described above, executing on a hardware processor.

Further, a computer program product can include a tangible computer-readable recordable storage medium with code adapted to be executed to carry out at least one method step described herein, including the provision of the system with the distinct software modules.

Additionally, the techniques depicted in FIG. 10 can be implemented via a computer program product that can include computer useable program code that is stored in a computer readable storage medium in a data processing system, and wherein the computer useable program code was downloaded over a network from a remote data processing system. Also, in an aspect of the invention, the computer program product can include computer useable program code that is stored in a computer readable storage medium in a server data processing system, and wherein the computer useable program code is downloaded over a network to a remote data processing system for use in a computer readable storage medium with the remote system.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in a computer readable medium having computer readable program code embodied thereon.

An aspect of the invention or elements thereof can be implemented in the form of an apparatus including a memory and at least one processor that is coupled to the memory and operative to perform exemplary method steps.

Figure 11:
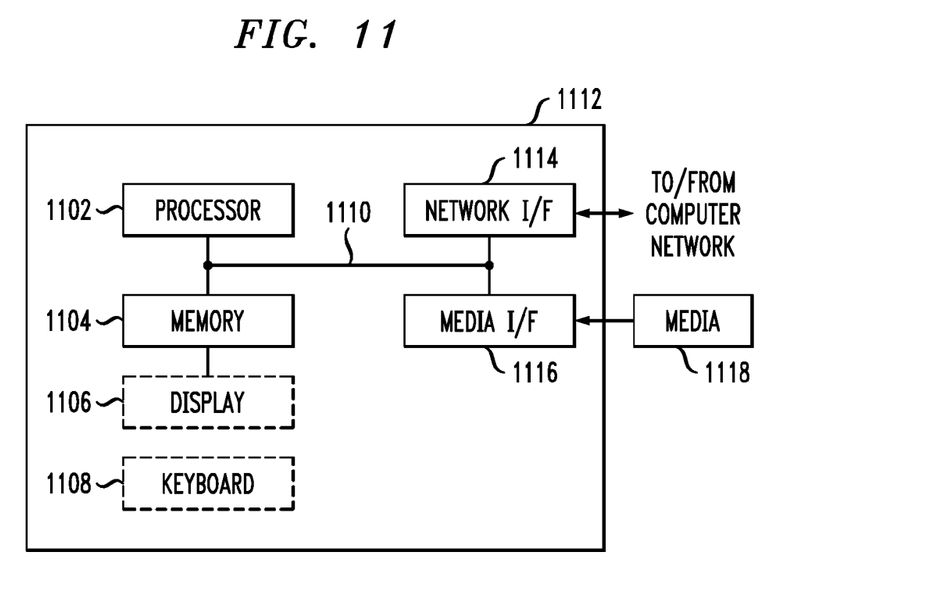
FIG. 11 is a system diagram of an exemplary computer system on which at least one embodiment of the invention can be implemented.

Additionally, an aspect of the present invention can make use of software running on a general purpose computer or workstation. With reference to FIG. 11, such an implementation might employ, for example, a processor 1102, a memory 1104, and an input/output interface formed, for example, by a display 1106 and a keyboard 1108. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like.

In addition, the phrase "input/output interface" as used herein, is intended to include, for example, a mechanism for inputting data to the processing unit (for example, mouse), and a mechanism for providing results associated with the processing unit (for example, printer). The processor 1102, memory 1104, and input/output interface such as display 1106 and keyboard 1108 can be interconnected, for example, via bus 1110 as part of a data processing unit 1112. Suitable interconnections, for example via bus 1110, can also be provided to a network interface 1114, such as a network card, which can be provided to interface with a computer network, and to a media interface 1116, such as a diskette or CD-ROM drive, which can be provided to interface with media 1118.

Accordingly, computer software including instructions or code for performing the methodologies of the invention, as described herein, may be stored in an associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 1102 coupled directly or indirectly to memory elements 1104 through a system bus 1110. The memory elements can include local memory employed during actual implementation of the program code, bulk storage, and cache memories which provide temporary storage of at least some program code in order to reduce the number of times code must be retrieved from bulk storage during implementation.

Input/output or I/O devices (including but not limited to keyboards 1108, displays 1106, pointing devices, and the like) can be coupled to the system either directly (such as via bus 1110) or through intervening I/O controllers (omitted for clarity).

Network adapters such as network interface 1114 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 1112 as shown in FIG. 11) running a server program. It will be understood that such a physical server may or may not include a display and keyboard.

As noted, aspects of the present invention may take the form of a computer program product embodied in a computer readable medium having computer readable program code embodied thereon. Also, any combination of one or more computer readable medium(s) may be utilized. The computer readable medium may be a computer readable signal medium or a computer readable storage medium.

A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of at least one programming language, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. Accordingly, an aspect of the invention includes an article of manufacture tangibly embodying computer readable instructions which, when implemented, cause a computer to carry out a plurality of method steps as described herein.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, component, segment, or portion of code, which comprises at least one executable instruction for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should be noted that any of the methods described herein can include an additional step of providing a system comprising distinct software modules embodied on a computer readable storage medium; the modules can include, for example, any or all of the components detailed herein. The method steps can then be carried out using the distinct software modules and/or sub-modules of the system, as described above, executing on a hardware processor 1102. Further, a computer program product can include a computer-readable storage medium with code adapted to be implemented to carry out at least one method step described herein, including the provision of the system with the distinct software modules.

In any case, it should be understood that the components illustrated herein may be implemented in various forms of hardware, software, or combinations thereof; for example, application specific integrated circuit(s) (ASICs), functional circuitry, an appropriately programmed general purpose digital computer with associated memory, and the like. Given the teachings of the invention provided herein, one of ordinary skill in the related art will be able to contemplate other implementations of the components of the invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of another feature, integer, step, operation, element, component, and/or group thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

At least one aspect of the present invention may provide a beneficial effect such as, for example, producing a constant power output rate from a wind farm having minimal variability.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An article of manufacture comprising a computer readable storage medium having computer readable instructions tangibly embodied thereon which, when implemented, cause a computer to carry out a plurality of method steps comprising:

obtaining (i) forecasted wind power production, (ii) actual wind power exported from a wind power producer to a grid by interfacing with a monitoring device at the wind power producer to measure actual power generated by the wind power producer, (iii) a variable price of power measurement, (iv) a power storage battery state and capacity measurement by interfacing with an energy storage management system to collect battery data, and (v) a monetary penalty for wind power change of output rate;

analyzing:

the forecasted wind power production (P(t)) by time step t, the actual wind power exported from the wind power producer to the grid (C(t)) by time step t, the variable price of power measurement (PRICE(t)) at time step t, the power storage battery state (b(t)) at the end of time step t and capacity measurement (B), wherein the power storage battery state (b(t)) at the end of time step t is based on the forecasted wind power production (P(t)) by time step t, the actual wind power exported from the wind power producer to the grid (C(t)) by time step t, and the capacity measurement (B), and the monetary penalty for wind power change of rate (PENALTY(t)) at time step t to determine a piece-wise linear output rate at which wind power is to be exported from the wind power producer to the grid which maximizes revenue for the wind power producer, wherein said determining the piece-wise linear output rate comprises determining an output rate for each of a given number of multiple discrete subsequent time steps (t) via:

$$\max_{C(t),b(t),W(t) \forall t} \sum_t \Delta C(t) \text{PRICE}(t) - \sum_t V(t) \text{PENALTY}(t),$$

wherein W(t) represents cumulative wastage by time step t, and wherein V(t) represents a maximum of change in the amount of power exported from the wind power producer to the grid at time step t; and outputting, to an output limiter component, a series of rate-duration pairs causing power to be exported from the wind power producer to the grid in accordance with said determined piece-wise linear output rate.

2. The article of manufacture of claim 1, wherein the analyzing comprises analyzing at each of multiple discrete time steps to determine the piece-wise linear output rate at which power is to be exported from the power producer to the grid during the next discrete time step.

3. The article of manufacture of claim 2, wherein analyzing at each of multiple discrete time comprises solving an optimization problem once every pre-determined number of time steps using a linear program to determine a consistent output rate for the next time step.

4. The article of manufacture of claim 1, wherein the method steps are carried out continuously in an online manner.

5. The article of manufacture of claim 4, wherein the method steps comprise:

outputting, to an output limiter component, a storage battery state and capacity and a series of rate-duration pairs at which power is to be exported to the grid.

6. The article of manufacture of claim 1, wherein the method steps comprise:

integrating an energy storage management system to manage an energy storage system.

7. A system for determining consistent wind power output, comprising:

a memory; and at least one processor coupled to the memory and operative for:

obtaining (i) forecasted wind power production, (ii) actual wind power exported from a wind power producer to a grid by interfacing with a monitoring device at the wind power producer to measure actual power generated by the wind power producer, (iii) a variable price of power measurement, (iv) a power storage battery state and capacity measurement by interfacing with an energy storage management system to collect battery data, and (v) a monetary penalty for wind power change of output rate;

analyzing:

the forecasted wind power production (P(t)) by time step t, the actual wind power exported from the wind power producer to the grid (C(t)) by time step t, the variable price of power measurement (PRICE(t)) at time step t, the power storage battery state (b(t)) at the end of time step t and capacity measurement (B), wherein the power storage battery state (b(t)) at the end of time step t is based on the forecasted wind power production (P(t)) by time step t, the actual wind power exported from the wind power producer to the grid (C(t)) by time step t, and the capacity measurement (B), and the monetary penalty for wind power change of rate (PENALTY(t)) at time step t to determine a piece-wise linear output rate at which wind power is to be exported from the wind power producer to the grid which maximizes revenue for the wind power producer, wherein said determining the piece-wise linear output rate comprises determining an output rate for each of a given number of multiple discrete subsequent time steps (t) via:

$$\max_{C(t),b(t),W(t) \forall t} \sum_t \Delta C(t) \text{PRICE}(t) - \sum_t V(t) \text{PENALTY}(t),$$

wherein W(t) represents cumulative wastage by time step t, and wherein V(t) represents a maximum of change in the amount of power exported from the wind power producer to the grid at time step t; and outputting, to an output limiter component, a series of rate-duration pairs causing power to be exported from the wind power producer to the grid in accordance with said determined piece-wise linear output rate.

8. The system of claim 7, wherein the at least one processor is further operative for analyzing at each of multiple discrete time steps to determine the piece-wise linear output rate at which power is to be exported from the power producer to the grid during a next discrete time step.

9. The system of claim 8, wherein the at least one processor is further operative for solving an optimization problem once every pre-determined number of time steps using a linear program to determine a consistent output rate for the next time step.

10. The system of claim 7, wherein the system for providing consistent wind power output operates continuously in an online manner.

11. The system of claim 10, wherein the at least one processor is further operative for:

outputting, to an output limiter component, a storage battery state and capacity and a series of rate-duration pairs at which power is to be exported to the grid.

12. The system of claim 7, wherein the at least one processor is further operative for:

integrating an energy storage management system to manage an energy storage system.

13. A system for determining consistent wind power output, the system comprising:

an interface for interfacing with a monitoring device at a wind power producer to measure actual power exported from the wind power producer to a grid;

an interface for interfacing with an energy storage management system to collect battery data;

an interface for interfacing with a wind forecast system to collect a wind power forecast for the wind power producer;

an interface for interfacing with one or more entities to collect energy prices and output rate variation penalty information, wherein the output rate variation penalty information comprises a monetary penalty;

a server to analyze the collected forecasted wind power (P(t)) by time step t, the measured actual wind power exported from the wind power producer to the grid (C(t)) by time step t, the collected energy prices (PRICE(t)) at time step t, power storage battery state (b(t)) at the end of time step t and capacity measurement (B) from the collected battery data, wherein the power storage battery state (b(t)) at the end of time step t is based on the forecasted wind power production (P(t)) by time step t, the actual wind power exported from the wind power producer to the grid (C(t)) by time step t, and the capacity measurement (B), and the collected penalty information for wind power change of rate (PENALTY(t)) at time step t to:

determine a piece-wise linear output rate at which wind power is to be exported from the wind power producer to the grid which maximizes revenue for the wind power producer, wherein said determining the piece-wise linear output rate comprises determining an output rate for each of a given number of multiple discrete subsequent time steps (t) via:

$$\max_{C(t),b(t),W(t)\forall t} \sum_t \Delta C(t)\text{PRICE}(t) - \sum_t V(t)\text{PENALTY}(t),$$

wherein W(t) represents cumulative wastage by time step t, and wherein V(t) represents a maximum of change in the amount of power exported from the wind power producer to the grid at time step t, and
produce instructions for the exporting; and an output limiter to process the instructions on the piece-wise linear output rate causing wind power to be exported from the wind power producer to the grid in accordance with said instructions.

* * * * *